United States Patent
Feng

(10) Patent No.: US 9,646,786 B1
(45) Date of Patent: May 9, 2017

(54) HALL PRINCIPLE-BASED LED LIT MECHANICAL KEYBOARD SWITCH

(71) Applicant: Dongguan Gaote Electronics CO., LTD, Dongguan, Guangdong Province (CN)

(72) Inventor: Jianqing Feng, Dongguan (CN)

(73) Assignee: Dongguan Gaote Electronics Co., Ltd., Dongguan (CN)

( * ) Notice: Subject to any disclaimer, the term of this patent is extended or adjusted under 35 U.S.C. 154(b) by 0 days.

(21) Appl. No.: 15/233,976

(22) Filed: Aug. 11, 2016

(30) Foreign Application Priority Data

Nov. 24, 2015 (CN) .......................... 2015 1 0824868

(51) Int. Cl.
| | | |
|---|---|---|
| *H01H 9/00* | (2006.01) | |
| *H01H 36/00* | (2006.01) | |
| *H01H 13/83* | (2006.01) | |
| *H01H 13/14* | (2006.01) | |
| *H01H 13/04* | (2006.01) | |
| *H01H 13/85* | (2006.01) | |

(52) U.S. Cl.
CPC ........ *H01H 36/0073* (2013.01); *H01H 13/04* (2013.01); *H01H 13/14* (2013.01); *H01H 13/83* (2013.01); *H01H 13/85* (2013.01); *H01H 2235/01* (2013.01)

(58) Field of Classification Search
CPC ...................................... H01H 13/83
USPC .................................. 200/300–314
See application file for complete search history.

(56) References Cited

U.S. PATENT DOCUMENTS

| | | | | |
|---|---|---|---|---|
| 6,747,226 B2 * | 6/2004 | Watanabe | ............ | H01H 13/023 200/314 |
| 8,253,048 B2 * | 8/2012 | Ozias | ...................... | H01H 13/83 200/314 |
| 8,748,767 B2 * | 6/2014 | Ozias | .................... | G06F 1/1662 200/310 |
| 2006/0000699 A1 * | 1/2006 | Sasaki | .................... | H01H 13/28 200/341 |
| 2010/0288607 A1 * | 11/2010 | Ozias | ..................... | H01H 13/83 200/310 |
| 2011/0168532 A1 * | 7/2011 | Tsai | ........................ | H01H 13/83 200/314 |
| 2016/0055988 A1 * | 2/2016 | Muller | ................. | H01H 13/023 200/314 |

* cited by examiner

*Primary Examiner* — Alexander Talpalatski
(74) *Attorney, Agent, or Firm* — Bay State IP, LLC

(57) ABSTRACT

The present invention relates to a Hall Principle-based LED lit mechanical keyboard switch comprising a keymodule, permanent magnet, housing, LED lamp, Hall switch, elastic strip, top cover and spring; the keymodule consists of a plunger and a slider, the plunger has a key on top and a first locating pole at bottom; the slider has magnet mounting slot on its side wall; a second locating pole is provided at the bottom center inside the housing, the second locating pole is provided with a guide hole at its center, and a LED lamp mounting hole is provided on one side in the housing; Hall switch mounting hole and plunger slideway are provided on the neighboring side next to the side of the housing on which LED lamp mounting hole is provided.

9 Claims, 5 Drawing Sheets

HALL PRINCIPLE-BASED LED LIT MECHANICAL KEYBOARD SWITCH

CROSS REFERENCE TO RELATED APPLICATION

This application claims the benefit of and takes priority from Chinese Patent Application No. 20151082486.8 filed on Nov. 24, 2015, the contents of which are herein incorporated by reference.

TECHNICAL FIELD

The present invention relates to photoelectric technical field, in particular, to a Hall Principle-based LED lit mechanical keyboard switch.

BACKGROUND ART

Nowadays, more and more computer users and game players have a higher requirement on the comfort level, tactile feel and quality of computer use. As one of computer peripherals, keyboard has also undergone a certain changes. Mechanical keyboards are not only the fanciers' favorite, but also favored by more and more users who are admirers of quality and tactile feel.

As is well known, each and every key of a mechanical keyboard includes an independent keyboard switch. Such keyboard switch comprises a base and a housing, and the base and the housing are engaged to form a cavity, in which keymodule, spring, static contact piece, dynamic contact piece and LED lamp, etc. are placed. Due to its own structural characteristics, the mechanical keyboard switch of the aforesaid structure has such problems as short service life, long switch response time and poor contact stability, etc. Furthermore, ingress of dust or liquid into the keyboard switch can easily interfere with the normal operation of the keyboard switch.

DESCRIPTION OF THE INVENTION

To solve the above problems existing with the prior art, the present invention discloses a Hall Principle-based LED lit mechanical keyboard switch, which has such advantages as long service life, short response time as well as water- and dust-resistance, etc.

Technical solution adopted by the present invention: A Hall Principle-based LED lit mechanical keyboard switch comprising a keymodule, permanent magnet, housing, LED lamp, Hall switch, elastic strip, top cover and spring;

The said keymodule consists of a plunger and a slider, the said plunger and slider are either fixedly or movably connected; the said plunger has a key on its top and a first locating pole at its bottom; the said slider has magnet mounting slot on its side wall, and the said permanent magnet is provided in the said magnet mounting slot;

A second locating pole is provided at the bottom center inside the said housing, the said second locating pole is provided with a guide hole at its center, and a LED lamp mounting hole is provided on one side in the said housing, which is intended for mounting the said LED lamp; Hall switch mounting hole and plunger slideway are provided on the neighboring side next to the side of the said housing on which the said LED lamp mounting hole is provided, the said Hall switch mounting hole is used for mounting the said Hall switch, and the said plunger and plunger slideway are in a sliding fit; elastic strip mounting hole is provided on the side opposite the side of the said housing on which the said LED lamp mounting hole is provided, which is used for mounting the said elastic strip;

The said top cover is removably covered on the said housing, and the said top cover and the housing are engaged to form a cavity; inside the said cavity, the said key passes through the top of the said top cover, and the said first locating pole is embedded in the guide hole, and the said first locating pole can move up and down along the said guide hole; the said spring is located between the said keymodule and the housing, one end of the said spring is connected with the said first locating pole, and its other end is connected with the said second locating pole.

Furthermore, the said LED lamp utilizes insert-type LED lamp.

Furthermore, on the left and right sides of the said elastic strip is respectively provided a semi-circular slideway, and below the said slideway, a grab is provided at the lower end of the said elastic strip, and the said elastic strip is fixed in the said elastic strip mounting hole by the said grab.

Furthermore, a first lock is provided respectively on the two parallel side walls among the outer sidewalls of the said housing, a second lock is provided respectively on the perimeter of the bottom end of the said top cover, and the said housing is engaged with the top cover by the said first lock and second lock.

Furthermore, an anti-interference hood is also provided in the Hall Principle-based LED lit mechanical keyboard switch, and the said anti-interference hood is covered on the said Hall switch.

Furthermore, a fixing iron plate and a PCB board are also provided in the Hall Principle-based LED lit mechanical keyboard switch, and the said PCB board is located below and in parallel with the said fixing iron plate; a first center hole is provided on the said fixing iron plate, dimensions of the said first center hole are in match with the outline dimensions of the said housing, and the said housing is locked in the said first center hole; a second center hole, SMD LED lamp mounting hole and jack are provided on the said PCB board, the bottom end of the second locating pole in the said housing is embedded in the second center hole, the SMD LED lamp is welded in the said SMD LED lamp mounting hole, and pins of the said Hall switch is welded in the jacks.

Furthermore, the said housing has a lock on its outer sidewall, and the said housing is fixed in the said first center hole by the said lock.

Furthermore, the said key adopts a columnar structure with a straight, cross-shaped or triangular cross-section.

Furthermore, the said key is mounted without any soldering point.

With the aforementioned technical solutions adopted, the present invention has the following beneficial effects: the present invention has such advantages as long service life, short response time as well as water- and dust-resistance, etc. The present invention does not lose any touch feel of mechanical switches, and gives a feel of tactile bump. The present invention is characterized by simple structure, easy fabrication, low manufacturing cost, and allows for easy and swift replacement of the mechanical switch. The present invention allows for emitting multi-color backlight.

In the figures: 1. Keymodule; 11. Plunger; 111. Key; 112. The first locating pole; 12. Slider; 121. Magnet mounting slot; 2. Permanent magnet; 3. Housing; 31. The second locating pole; 32. Guide hole; 4. LED lamp; 5. Hall switch; 6. Elastic strip; 61. Slideway; 62. Lock; 7. Top cover; 8. Spring; 9. Anti-interference hood; 101. Fixing iron plate; 1011. The first center hole; 102. PCB board; 1021. The second center hole; 1022. SMD LED lamp mounting hole; 1023. Jack.

DETAILED DESCRIPTION OF THE PREFERRED EMBODIMENTS

Figure 1:
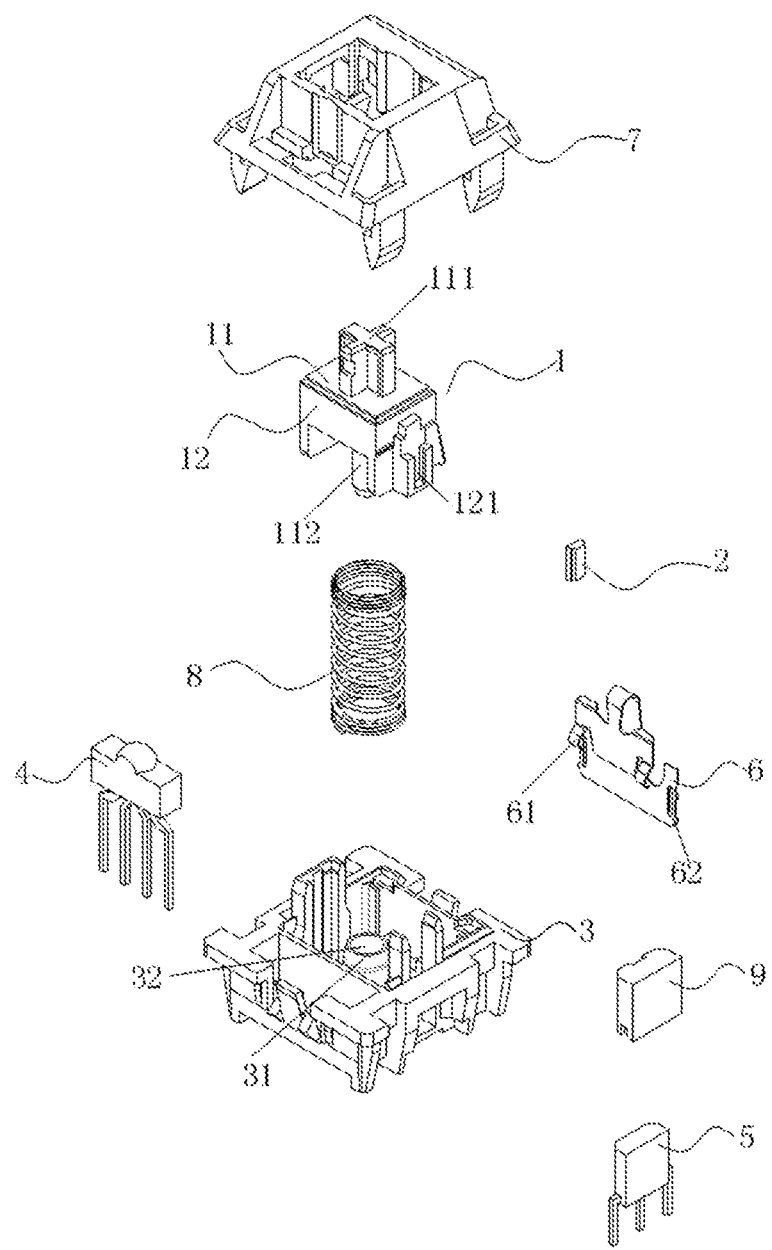
FIG. 1 is the first explosive view of a Hall Principle-based LED lit mechanical keyboard switch according to the present invention.
Figure 2:
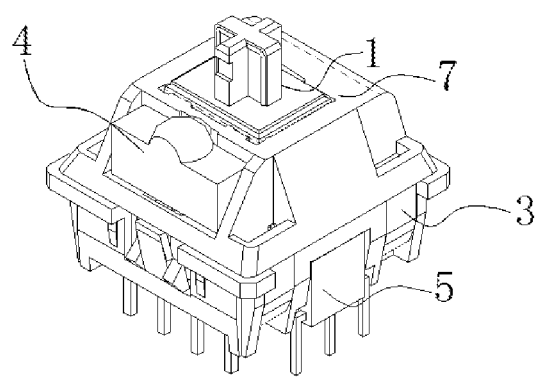
FIG. 2 is a 3-dimensional view of a Hall Principle-based LED lit mechanical keyboard switch according to the present invention.

As shown in FIGS. 1 and 2, the present invention discloses a Hall Principle-based LED lit mechanical keyboard switch, comprising a keymodule 1, permanent magnet 2, housing 3, LED lamp 4, Hall switch 5, elastic strip 6, top cover 7 and spring 8.

The keymodule 1 consists of a plunger 11 and a slider 12, plunger 11 and slider 12 are either fixedly or movably connected; plunger 11 has a key 111 on its top and a first locating pole 112 at its bottom. Slider 12 has a magnet mounting slot 121 on its side wall, and the permanent magnet 2 is provided in the magnet mounting slot 121.

A second locating pole 31 is provided at the bottom center inside housing 13, the second locating pole 31 is provided with a guide hole 32 at its center. A LED lamp mounting hole is provided on one side in the housing 3, which is intended for mounting LED lamp 4. Furthermore, LED lamp 4 utilizes insert-type LED lamp. Hall switch mounting hole and plunger slideway are provided on the neighboring side next to the side of the housing 3 on which the LED lamp mounting hole is provided, the Hall switch mounting hole is used for mounting the said Hall switch 5, and the plunger 11 and plunger slideway are in a sliding fit. An elastic strip mounting hole is provided on the side opposite the side of the housing 3 on which the said LED lamp mounting hole is provided, which is used for mounting elastic strip 6. Furthermore, on the left and right sides of the elastic strip 6 is respectively provided a semi-circular slideway 61, and below the slideway 61, a grab 62 is provided at the lower end of the elastic strip 6, and the elastic strip 6 is fixed in the elastic strip mounting hole by the said grab 62.

The top cover 7 is removably covered on the housing 3, and the top cover 7 and the housing 3 are engaged to form a cavity. Inside the said cavity, key 111 on top of plunger 11 passes through the top of the top cover 7, and the first locating pole 112 at bottom of plunger 11 is embedded in the guide hole 32 in the second locating pole 31 of housing 3, and the first locating pole 112 can move up and down along the guide hole 32. Spring 8 is located between keymodule 1 and housing 3, one end of the spring 8 is connected with the first locating pole 112, and its other end is connected with the second locating pole 31.

In the above embodiment, a first lock is provided respectively on the two parallel side walls among the outer sidewalls of housing 3, a second lock is provided respectively on the perimeter of the bottom end of top cover 7, and the housing 3 is engaged with the top cover 7 by the first lock and second lock, which, on one hand, allows for easy disassembly, replacement and maintenance of the mechanical keyboard switch according to the present invention, and on the other hand, can prevent dust or liquid from getting in touch with any component inside the cavity formed by top cover 7 and housing 3.

In the above embodiment, in order to prevent any magnetic field in the external environment from interfering with Hall switch 5, an anti-interference hood 9 is also provided in the Hall Principle-based LED lit mechanical keyboard key according to the present invention, and the anti-interference hood 9 is covered on the Hall switch.

Figure 3:
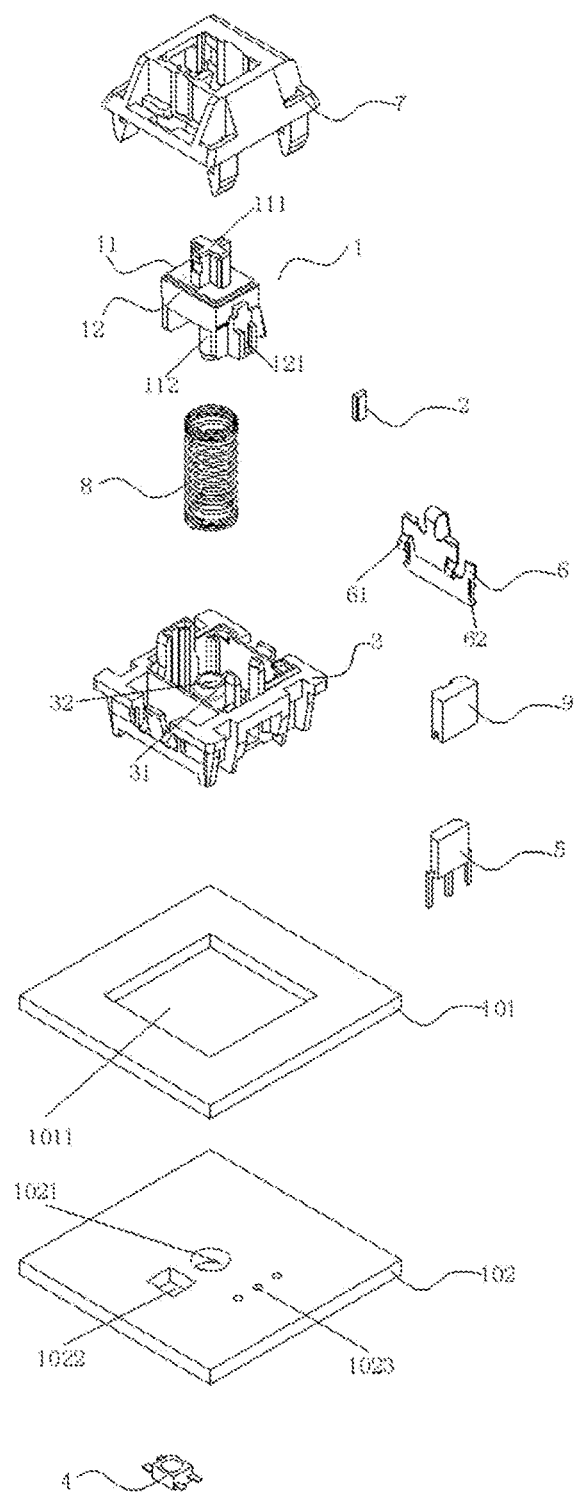
FIG. 3 is the second explosive view of a Hall Principle-based LED lit mechanical keyboard switch according to the present invention.
Figure 4:
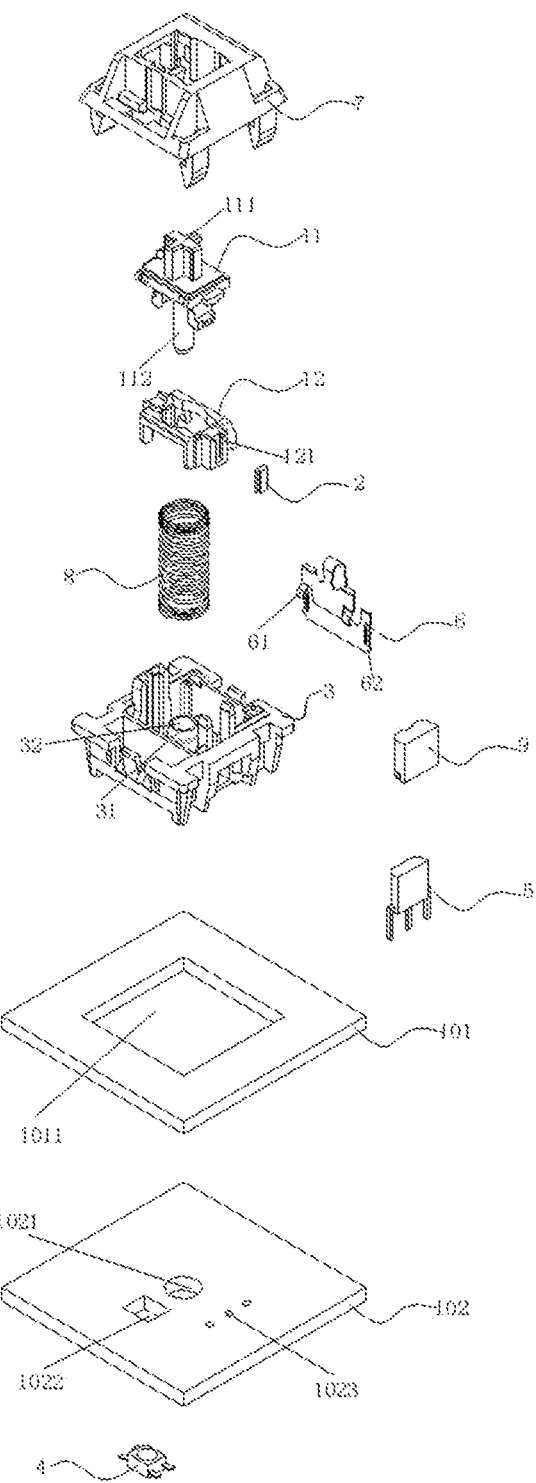
FIG. 4 is the third explosive view of a Hall Principle-based LED lit mechanical keyboard switch according to the present invention.
Figure 5:
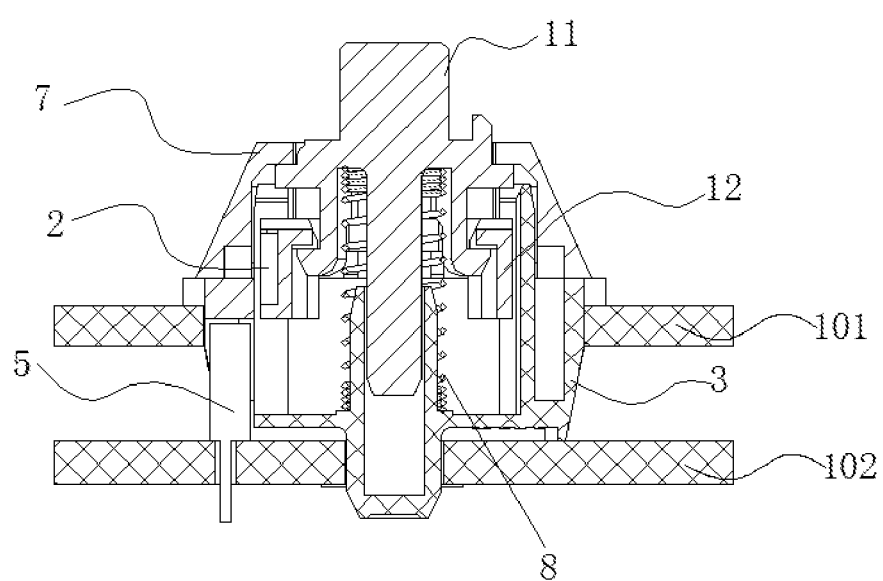
FIG. 5 is a sectional view showing a Hall Principle-based LED lit mechanical keyboard switch according to the present invention.

In the above embodiment, as shown in FIG. 3 thru 5, LED lamp 4 may also utilize SMD LED lamp 4. When SMD LED lamp 4 is used, a fixing iron plate 101 and a PCB board 102 are also provided in the Hall Principle-based LED lit mechanical keyboard switch according to the present invention, and the PCB board 102 is located below and in parallel with the fixing iron plate 101. A first center hole 1011 is provided on the fixing iron plate 101, dimensions of the first center hole 1011 are in match with the outline dimensions of housing 3, and the housing 3 is locked in the first center hole 1011. A second center hole 1021, SMD LED lamp mounting hole 1022 and jack 1023 are provided on PCB board 102, the bottom end of the second locating pole 31 in housing 3 is embedded in the second center hole 1021, the SMD LED lamp 4 is welded in the SMD LED lamp mounting hole 1022, and pins of the Hall switch 5 is welded in the jack 1023. Furthermore, housing 3 has a lock on its outer sidewall, the lock is provided on the sidewall next to the sidewall on which the first lock is provided, and housing 3 is fixed in the first center hole 1011 of fixing iron plate 101 by the said lock.

In the above embodiment, the shape of key 111 is changeable, which can adopt a columnar structure with a straight, cross-shaped or triangular cross-section. Furthermore, key 111 is mounted without any soldering point, allowing for quick and easy maintenance and replacement thereof.

Working process of the Hall Principle-based LED lit mechanical keyboard switch according to the present invention is described below:

In its initial state, keymodule 1 keeps permanent magnet 2 misplaced with Hall switch 5, at which point, the circuit is in an OFF state. When an external force is exerted on key 111 of plunger 11 depressing plunger 11 downward, spring 8 is in a compressed state, slider 12 moves downwards along with plunger 11, and slider 12 comes into contact with slideway 61 of elastic strip 6, producing a feel of tactile bump; meanwhile, the permanent magnet 2 on slider 12 produces a magnetic field, which begins to influence Hall switch 5, causing Hall switch 5 to be conducted, at which point, the circuit is in an ON state. When the external force disappears, plunger 11 automatically resets upwards under the action of spring 8, making permanent magnet 2 and Hall switch 5 to misplace again, where the circuit is in an OFF state. When the circuit is in an ON state, LED lamp 4 produces backlight, allowing for easy use by users.

With the aforementioned structural design, the Hall Principle-based LED lit mechanical keyboard switch according to the present invention can solve the technical problems existing with the prior art, and it has such advantages as long service life, short switch response time as well as water- and dust-resistance, etc. Additionally, the present invention does not lose any feel of mechanical keyboards and gives the feel of tactile bump. The present invention is characterized by simple structure, easy fabrication and low manufacturing cost. The present invention can also utilize insert-type LED lamp 4 and SMD LED lamp 4 in the same time, and lights emitted by insert-type LED lamp 4 and SMD LED lamp 4 are combined to produce multi-color light, resulting in a multi-color backlight effect.

The present invention is not limited to the aforementioned preferred embodiments, any person under the inspiration of the present invention might be able to come up with other various forms of products, however, regardless of any change in their shape or structure, any technical scheme identical or similar to the present application shall all fall within the scope of the present invention.

What is claimed is:

1. A Hall Principle-based LED lit mechanical keyboard switch, wherein it comprises a keymodule, permanent magnet, housing, LED lamp, Hall switch, elastic strip, top cover and spring;

The said keymodule consists of a plunger and a slider, the said plunger and slider are either fixedly or movably connected; the said plunger has a key on its top and a first locating pole at its bottom; the said slider has magnet mounting slot on its side wall, and the said permanent magnet is provided in the said magnet mounting slot;

a second locating pole is provided at the bottom center inside the said housing, the said second locating pole is provided with a guide hole at its center, and a LED lamp mounting hole is provided on one side in the said housing, which is intended for mounting the said LED lamp; Hall switch mounting hole and plunger slideway are provided on the neighboring side next to the side of the said housing on which the said LED lamp mounting hole is provided, the said Hall switch mounting hole is used for mounting the said Hall switch, and the said plunger and plunger slideway are in a sliding fit; elastic strip mounting hole is provided on the side opposite the side of the said housing on which the said LED lamp mounting hole is provided, which is used for mounting the said elastic strip;

the said top cover is removably covered on the said housing, and the said top cover and the housing are engaged to form a cavity; inside the said cavity, the said key passes through the top of the said top cover, and the said first locating pole is embedded in the guide hole, and the said first locating pole can move up and down along the said guide hole; the said spring is located between the said keymodule and the housing, one end of the said spring is connected with the said first locating pole, and its other end is connected with the said second locating pole.

2. A Hall Principle-based LED lit mechanical keyboard switch according to claim 1, wherein the said LED lamp utilizes insert-type LED lamp.

3. A Hall Principle-based LED lit mechanical keyboard switch according to claim 1, wherein the said Furthermore, on the left and right sides of the said elastic strip is respectively provided a semi-circular slideway, and below the said slideway, a grab is provided at the lower end of the said elastic strip, and the said elastic strip is fixed in the said elastic strip mounting hole by the said grab.

4. A Hall Principle-based LED lit mechanical keyboard switch according to claim 1, wherein a first lock is provided respectively on the two parallel side walls among the outer sidewalls of the said housing, a second lock is provided respectively on the perimeter of the bottom end of the said top cover, and the said housing is engaged with the top cover by the said first lock and second lock.

5. A Hall Principle-based LED lit mechanical keyboard switch according to claim 1, wherein an anti-interference hood is also provided, and the said anti-interference hood is covered on the said Hall switch.

6. A Hall Principle-based LED lit mechanical keyboard switch according to claim 1, wherein a fixing iron plate and a PCB board are also provided, and the said PCB board is located below and in parallel with the said fixing iron plate; a first center hole is provided on the said fixing iron plate, dimensions of the said first center hole are in match with the outline dimensions of the said housing, and the said housing is locked in the said first center hole; a second center hole, SMD LED lamp mounting hole and jack are provided on the said PCB board, the bottom end of the second locating pole in the said housing is embedded in the second center hole, the SMD LED lamp is welded in the said SMD LED lamp mounting hole, and pins of the said Hall switch is welded in the jacks.

7. A Hall Principle-based LED lit mechanical keyboard switch according to claim 6, wherein the said housing has a lock on its outer sidewall, and the said housing is fixed in the said first center hole by the said lock.

8. A Hall Principle-based LED lit mechanical keyboard switch according to claim 1, wherein the said key adopts a columnar structure with a straight, cross-shaped or triangular cross-section.

9. A Hall Principle-based LED lit mechanical keyboard switch according to claim 1, wherein the said key is mounted without any soldering point.

* * * * *